(12) United States Patent
Suen et al.

(10) Patent No.: US 8,801,228 B2
(45) Date of Patent: Aug. 12, 2014

(54) CHANGING LED LIGHT OUTPUT DISTRIBUTION THROUGH COATING CONFIGURATION

(75) Inventors: Dong Jung Suen, Guishan Township, Taoyuan County (TW); Chih-Hsun Sun, Kaohsiung (TW); Wei-Yu Yeh, Tainan (TW); Hsueh-Hung Fu, Hsinchu (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 35 days.

(21) Appl. No.: 13/420,927

(22) Filed: Mar. 15, 2012

(65) Prior Publication Data
US 2013/0242550 A1    Sep. 19, 2013

(51) Int. Cl.
*F21V 9/16* (2006.01)
*F21K 99/00* (2010.01)
*H01L 33/50* (2010.01)
*F21V 3/04* (2006.01)

(52) U.S. Cl.
CPC .............. *F21K 9/56* (2013.01); *H01L 33/504* (2013.01); *F21V 3/049* (2013.01)
USPC .............. 362/268; 362/331; 362/84; 362/147

(58) Field of Classification Search
CPC ......... F21V 5/008; F21V 9/16; F21V 3/0472; F21V 3/0481; G09F 13/20; F21K 9/56; F21K 2/00; F21K 9/00; F21S 48/1283; F21Y 2101/02; F21Y 2103/003

USPC ...................... 362/249.02, 223, 335, 147, 84, 362/311.02–311.05, 247, 268, 331
See application file for complete search history.

(56) References Cited

U.S. PATENT DOCUMENTS

| | | | |
|---|---|---|---|
| 7,156,547 B2 * | 1/2007 | Toshima et al. | 362/618 |
| 7,240,875 B2 * | 7/2007 | Hernandez et al. | 242/587.2 |
| 8,113,680 B2 * | 2/2012 | O'Brien et al. | 362/147 |
| 8,258,444 B2 * | 9/2012 | Ohtani et al. | 219/552 |
| 8,415,692 B2 * | 4/2013 | Le Toquin | 257/98 |
| 2009/0279175 A1 * | 11/2009 | Laney et al. | 359/599 |
| 2010/0328926 A1 * | 12/2010 | Hoelen et al. | 362/84 |
| 2011/0266574 A1 * | 11/2011 | Liao et al. | 257/98 |
| 2012/0057327 A1 * | 3/2012 | Le et al. | 362/84 |
| 2012/0147597 A1 * | 6/2012 | Farmer | 362/223 |
| 2012/0162978 A1 * | 6/2012 | Farmer | 362/223 |
| 2013/0094180 A1 | 4/2013 | Sun et al. | |
| 2013/0148346 A1 | 6/2013 | Sun et al. | |

* cited by examiner

*Primary Examiner* — Peggy Neils
(74) *Attorney, Agent, or Firm* — Haynes and Boone, LLP (57) ABSTRACT

The present disclosure provides a lighting instrument. The lighting instrument includes a recessed light fixture, for example a troffer light or a batten light. The light fixture includes a plurality of light-emitting diode (LED) devices located on a board. The light fixture also includes a diffuser cap located on the board and housing the LED devices therein. The diffuser cap includes a plurality of coating regions. Each coating region is coated by a film containing white particles. The white particles can reflect and diffuse light emitted by the LED devices. The film in each coating region has a different white particle concentration level than other coating regions.

20 Claims, 7 Drawing Sheets

CHANGING LED LIGHT OUTPUT DISTRIBUTION THROUGH COATING CONFIGURATION

TECHNICAL FIELD

The present disclosure relates generally to light-emitting devices, and more particularly, to a light-emitting diode (LED) lighting instrument with more uniform light output.

BACKGROUND

An LED device, as used herein, is a semiconductor light source for generating a light at a specified wavelength or a range of wavelengths. LED devices emit light when a voltage is applied. LED devices have increasingly gained popularity due to favorable characteristics such as small device size, long lifetime, efficient energy consumption, and good durability and reliability. In recent years, LED devices have been deployed in various applications, including indicators, light sensors, traffic lights, broadband data transmission, and illumination devices. For example, LED devices are often used in illumination devices provided to replace conventional incandescent light bulbs, such as those used in a troffer light. However, existing LED troffer lights may face shortcomings with respect to its light output. One shortcoming is that the light intensity is too strong in a center region of existing troffer lights. Another shortcoming is that the discrete LED devices in the troffer light may lead to light output hot spots. In other words, existing LED troffer lights may produce a light output that is not uniform but that includes a plurality of intensely lit regions surrounded by dimmer regions. These shortcomings of existing LED troffer lights may cause discomfort for a human user and is therefore undesirable.

Therefore, while conventional LED troffer lights have been generally adequate for their intended purposes, they have not been entirely satisfactory in every aspect. It is desired to provide an LED troffer light that is free of hot spots and that distributes light in more uniform fashion across all directions, similar to that of an incandescent light bulb.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

When turned on, light-emitting diode (LED) devices may emit radiation such as different colors of light in a visible spectrum, as well as radiation with ultraviolet or infrared wavelengths. Compared to traditional light sources (e.g., incandescent light bulbs), LED devices offer advantages such as smaller size, lower energy consumption, longer lifetime, variety of available colors, and greater durability and reliability. These advantages, as well as advancements in LED fabrication technologies that have made LED devices cheaper and more robust, have added to the growing popularity of LED devices in recent years.

Some of the LED-based applications include LED illumination devices, for example, LED lamps. These LED illumination devices are capable of replacing traditional illumination devices (such as incandescent light bulbs) in many aspects. However, existing LED illumination devices such as LED troffer lights may suffer from drawbacks involving non-uniform light distribution intensity (or luminous intensity or lumen density). For example, existing LED troffer lights may have a substantially greater light intensity at the center of its output (i.e., the front direction along which light is projected). As another example, existing LED troffer lights use a plurality of discrete LED devices (e.g., LED emitters) that may cause the troffer light output to contain a plurality of brighter spots surrounded by dimmer regions, which is otherwise known as a hot spot phenomenon. Due at least in part to these unfavorable light output characteristics, existing LED troffer lights may not be able to conform to the light distribution patterns of incandescent illumination devices. Therefore, the light output characteristics for existing LED troffer lights need to be improved.

Figure 1:
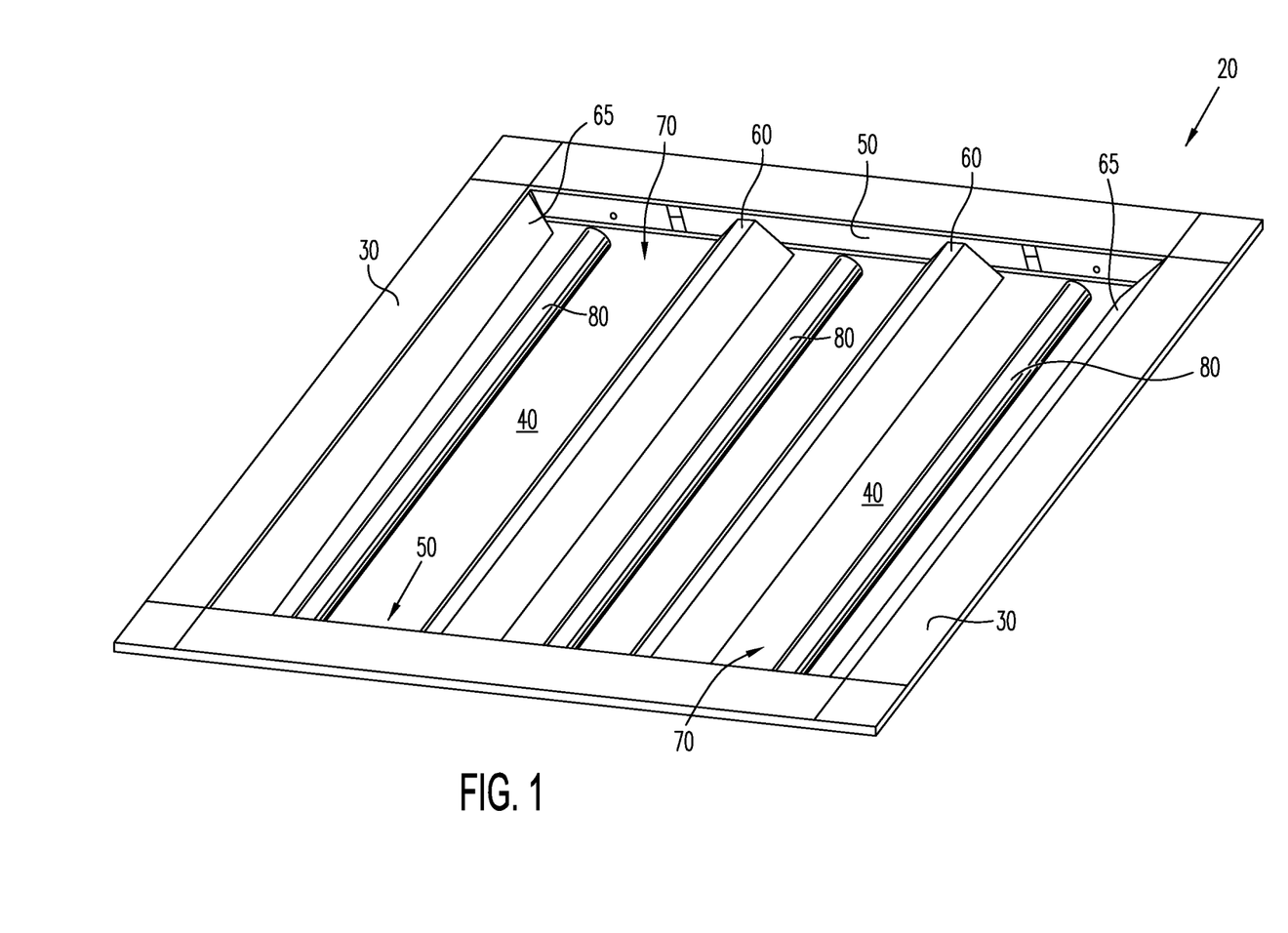
FIG. 1 is a simplified perspective view of a light fixture according to various aspects of the present disclosure.

According to various aspects of the present disclosure, described below is an improved LED troffer light that substantially overcomes the non-uniform light distribution issues associated with conventional LED troffer lights. In more detail, FIG. 1 is a diagrammatic perspective view of a troffer light fixture 20 according to certain embodiments of the present disclosure. The troffer light fixture 20 includes a body 30. The body 30 may be made of a metal material such as Aluminum in some embodiments, or may be made of other suitable materials in other embodiments. The body 30 is a concave structure and includes a rear frame 40 surrounded by sidewalls 50. Sidewall reflectors 65 are also disposed on at least two of the sidewalls 50. The sidewall reflectors 65 have a reflective surface operable to reflect light. The troffer light fixture 20 also includes a plurality of protruding structures 60 protruding outwards from the rear frame 40. The protruding structures 60, along with the rear frame 40, the sidewalls 50 and the sidewall reflectors of the body 30, form a plurality of recesses 70.

A light module 80 is implemented within each of the recesses 70. In the illustrated embodiments, the light module 80 has an elongate tubular shape and extends substantially from one sidewall 50 of the body 30 to another opposite sidewall 50. A plurality of discrete LED devices is implemented inside each light module 80. The surface of the light module 80 is a diffuser cap operable to diffuse and reflect light emitted by the LED devices housed therein. The light penetrating the diffuser cap (i.e., the light coming out of the light module 80) is reflected by the adjacently located protruding structures 60 and/or the sidewall reflectors 65, so as to help direct the light propagation along an intended path. In other words, the light output profile of the troffer light is partially shaped by the protruding structures 60 (which are also referred to as reflectors) as well as the sidewall reflectors 65.

Figure 2:
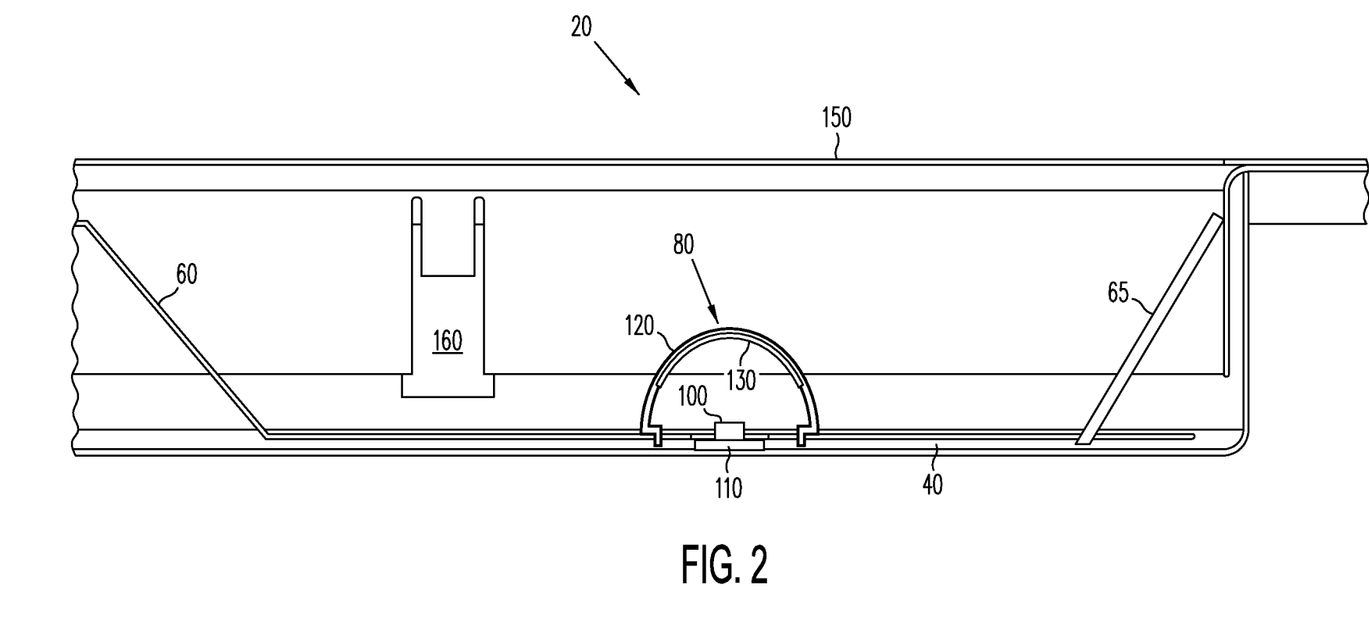
FIG. 2 is a simplified cross-sectional view of a portion of the light fixture of FIG. 1 according to various aspects of the present disclosure.

FIG. 2 is a diagrammatic fragmentary cross-sectional side view of a portion of the troffer light fixture 20 of FIG. 1. Referring to FIG. 2, an LED chip 100 is illustrated as an example one of the LED devices for each light module 80. The LED chip 100 may also be referred to as an LED emitter or an LED die. When the troffer light 20 includes multiple LED chips, the multiple LED chips are configured in an array for a desired illumination effect. For example, the multiple LED chips are configured in a manner such that the collective illumination from individual LED chips contributes to the emitted-light in a large angle with enhanced illumination uniformity. In some cases, the various LED chips collectively provide white illumination or other illumination effects according to particular applications. In various embodiments, each of the LED chips may further include one LED or a plurality of LEDs. As one example, when an LED chip includes multiple LEDs, those devices are electrically connected in series for high voltage operation, or further electrically connected in groups of series-coupled diodes in parallel to provide redundancy and robustness.

The device compositions of each LED device 100 are now described in greater detail. The LED chip 100 includes oppositely doped semiconductor layers (i.e., semiconductor layers having different types of conductivities). In some embodiments, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Iridium, and Titanium, and the V family elements may include Nitrogen, Phosphorous, Arsenic, Antimony, and Bismuth. In some embodiments, the oppositely doped semiconductor layers include a p-doped gallium nitride (GaN) material and an n-doped gallium nitride material, respectively. The p-type dopant may include Magnesium (Mg), and the n-type dopant may include Carbon (C) or Silicon (Si).

According to various embodiments, each LED chip 100 also includes a multiple-quantum well (MQW) layer that is disposed in between the oppositely doped layers. The MQW layer includes alternating (or periodic) sub-layers of active material, such as gallium nitride and indium gallium nitride (InGaN). For example, the MQW layer may include a number of gallium nitride sub-layers and a number of indium gallium nitride sub-layers, wherein the gallium nitride sub-layers and the indium gallium nitride sub-layers are formed in an alternating or periodic manner. In one embodiment, the MQW layer includes ten sub-layers of gallium nitride and ten sub-layers of indium gallium nitride, where an indium gallium nitride sub-layer is formed on a gallium nitride sub-layer, and another gallium nitride sub-layer is formed on the indium gallium nitride sub-layer, and so on and so forth. Each of the sub-layers within the MQW layer is oppositely doped from its adjacent sub-layer. That is, the various sub-layers within the MQW layer are doped in an alternating p-n fashion. The light emission efficiency depends on the number of layers of alternating layers and their thicknesses.

The doped layers and the MQW layer may all be formed by epitaxial growth processes known in the art. After the completion of the epitaxial growth processes, an LED device is created by the disposition of the MQW layer between the doped layers. When an electrical voltage is applied to the doped layers of the LED chips 100, the MQW layer emits light. The color of the light emitted by the MQW layer corresponds to the wavelength of the radiation. The radiation may be visible, such as blue light, or invisible, such as ultra-violet (UV) light. The wavelength of the light (and hence the color of the light) may be tuned by varying the composition and structure of the materials that make up the MQW layer.

In some embodiments, the LED chip 100 includes phosphor to convert the emitted light to a different wavelength of light. The scope of embodiments is not limited to any particular type of LED, nor is it limited to any particular color scheme. In some embodiments, one or more types of phosphors are disposed around the light-emitting diode for shifting and changing the wavelength of the emitted light, such as from ultra-violet (UV) to blue or from blue to yellow. The phosphor is usually in a powder form and is carried in other material such as epoxy or silicone (also referred to as phosphor gel). The phosphor gel is applied or molded to the LED chip 100 with suitable technique and can be further shaped with proper shape and dimensions.

The LED chip 100 may also contain electrodes for establishing electrical connections to its n-type and p-type layers, respectively. Each LED chip may be attached to a circuit board 110, which may be considered a portion of a carrier substrate. Wiring interconnections may be used to couple the electrodes of the LED chip 100 to electrical terminals on the circuit board. The LED chip 100 may be attached to the circuit board 110 through various conductive materials, such as silver paste, soldering, or metal bonding. In further embodiments, other techniques, such as through silicon via (TSV) and/or metal traces, may be used to couple the LED chip 100 to the circuit board 110.

If more than one LED chip 100 is used, those LED devices may share one circuit board 110. In certain embodiments, the circuit board 110 is a heat-spreading circuit board to effectively distribute and dissipate heat. In one example, a metal core printed circuit board (MCPCB) is utilized. MCPCBs can conform to a multitude of designs. An exemplary MCPCB includes a base metal, such as aluminum, copper, a copper alloy, and/or the like. A thin dielectric layer is disposed upon the base metal layer to electrically isolate the circuitry on the printed circuit board from the base metal layer below and to allow thermal conduction. The LED chip 100 and its related traces can be disposed upon the thermally conductive dielectric material.

In some examples, the metal base is in direct contact with a heat sink, whereas in other examples, an intermediate material between the heat sink and the circuit board 110 is used. Intermediate materials can include, e.g., double-sided thermal tape, thermal glue, thermal grease, and the like. Various embodiments can use other types of MCPCBs, such as MCPCBs that include more than one trace layer. The circuit board 110 may also be made of materials other than MCPCBs. For instance, other embodiments may employ circuit boards made of FR-4, ceramic, and the like.

In certain embodiments, the circuit board 110 may further include a power conversion module. Electrical power is typically provided to indoor lighting as alternating current (AC), such as 120V/60 Hz in the United States, and over 200V and 50 Hz in much of Europe and Asia, and incandescent lamps apply the ac power directly to the filament in the bulb. The LED chip 100 utilizes the power conversion module to change power from the typical indoor voltages/frequencies (high voltage alternating current (AC)) to power that is compatible with the LED chip 100 (low voltage direct current (DC)). In other examples, the power conversion module may be provided separately from the circuit board 110.

The LED chip 100 and/or the circuit board 110 may also be thermally coupled to a heat sink that dissipates the heat generated by the LED chip 100. According to various embodiments, the heat sink may include a metal, such as aluminum, copper, or other suitable thermally conductive materials. For reasons of simplicity, however, the heat sink is not illustrated herein.

As discussed above, each light module 80 includes a diffuser cap 120. The diffuser cap 120 may include a poly carbonate material and provides a cover for the LED chip 100 therebelow. Stated differently, the LED chip 100 is partially encapsulated by the diffuser cap 120. In some embodiments, the diffuser cap 120 has a curved surface or profile. In some embodiments, the curved surface may substantially follow the contours of a semicircle, so that each beam of light emitted by the LED chip 100 may reach the surface of the diffuser cap 120 at a substantially right incident angle, for example, within a few degrees of 90 degrees. The curved shape of the diffuser cap 120 helps reduce Total Internal Reflection (TIR) of the light emitted by the LED chip 100. In some embodiments, the diffuser cap 120 has a textured surface for further scattering of the incident light.

A film 130 is coated on a surface of the diffuser cap 120. In some embodiments, the film contains white particles that are operable to reflect and diffuse light emitted by the LED chip 100. The film 130 may be coated on various regions of the diffuser cap 120, and the white particle concentration level of the film 130 in each region may be different. The diffuser cap 120 and the film 130 are discussed in greater detail below.

Also as discussed above with reference to FIG. 1, the light module 80 is disposed on the rear frame 40, and the protruding structures 60 and the sidewall reflectors 65 serve as reflectors to reflect light propagating out of the light module 80. The troffer light fixture 20 may also optionally include a front cover 150 located opposite the rear frame 40. The front cover 150 may be substantially transparent to allow light emitted by the light module 80 to propagate therethrough. In some embodiments, the front cover 150 may also be textured to allow further scattering of the light emitted by the light module 80. The front cover 150 also provides mechanical protection for the light modules 80. In some embodiments, the front cover 150 may be secured to the rest of the troffer light fixture 20 through a fastening mechanism 160.

Figure 3:
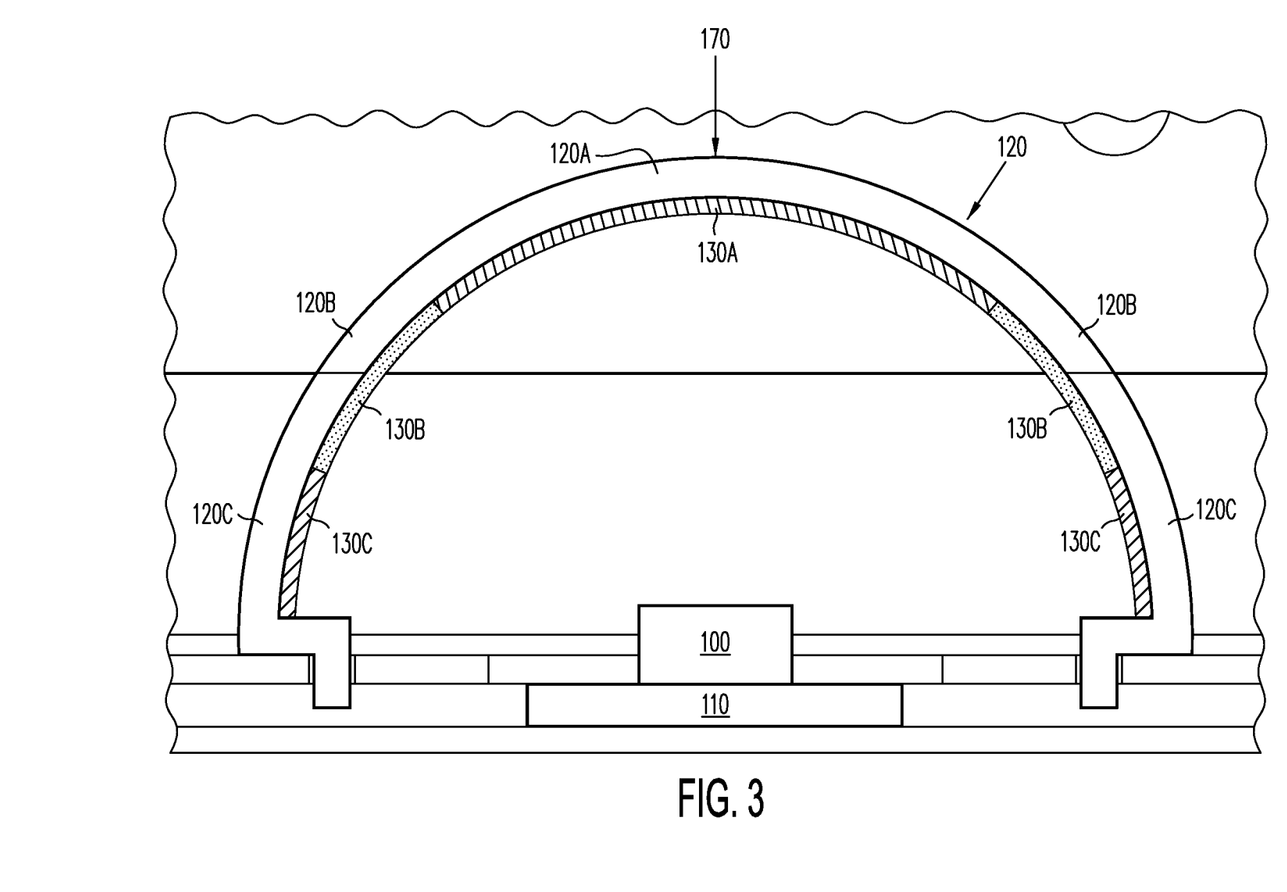
FIG. 3 is a more detailed cross-sectional view of the portion of the light fixture of FIG. 2 according to various aspects of the present disclosure.

FIG. 3 is a diagrammatic fragmentary cross-sectional side view of the LED chip 100 and the diffuser cap 120 in more detail. In the illustrated embodiments, the diffuser cap 120 is divided into a plurality of coating regions, for example coating regions 120A, 120B, and 120C. These coating regions 120A-120C may have different sizes, shapes, and geometries from each other. For example, one of them may be substantially larger than the others. For each of the coating regions 120A-120C, a respective coating film 130A-130C is applied.

In other words, a coating film 130A is applied to the coating region 120A, a coating film 130B is applied to the coating region 120B, etc.

The coating films 130A-130C each contain white particles, which are particles that diffuse and reflect light emitted by the LED chip 100. In some embodiment, the white particles include calcium sulfate, zinc oxide, barium sulfate, or titanium oxide. The coating films 130A-130C also each contain resin and/or silicone. In the illustrated embodiments, the coating regions 130A-130C have varying white particle concentration levels. Depending on the respective white particle concentration level, each coating region can have a corresponding light reflection and transmission characteristic.

For example, in some embodiments, a greater white particle concentration level corresponds to greater light reflection and less light transmission through the diffuser cap 120. Thus, by carefully configuring the coating regions (both of the number of coating regions and the geometries of each coating region) and by adjusting the white particle concentration level in each coating region, a desired light output profile can be obtained. As an example, since the LED-based troffer light fixture 20 tends to have a much greater light output intensity near its apex 170 (i.e., the center of the diffuser cap facing the LED chip 100), the white particle concentration level of the coating film 130A coated at the apex 170 may be configured to be the greatest (e.g., greater than that of the coating films 130B and 130C), so as to reduce glare and improve light output uniformity. In various other embodiments, a plurality of additional coating regions may be implemented, and the coating film for each region may be individually configured as necessary to achieve the desired light output pattern. In this manner, the light output of the troffer light fixture 20 may be substantially devoid of hot spots and may be more uniform compared to traditional troffer lights.

Figure 4A:
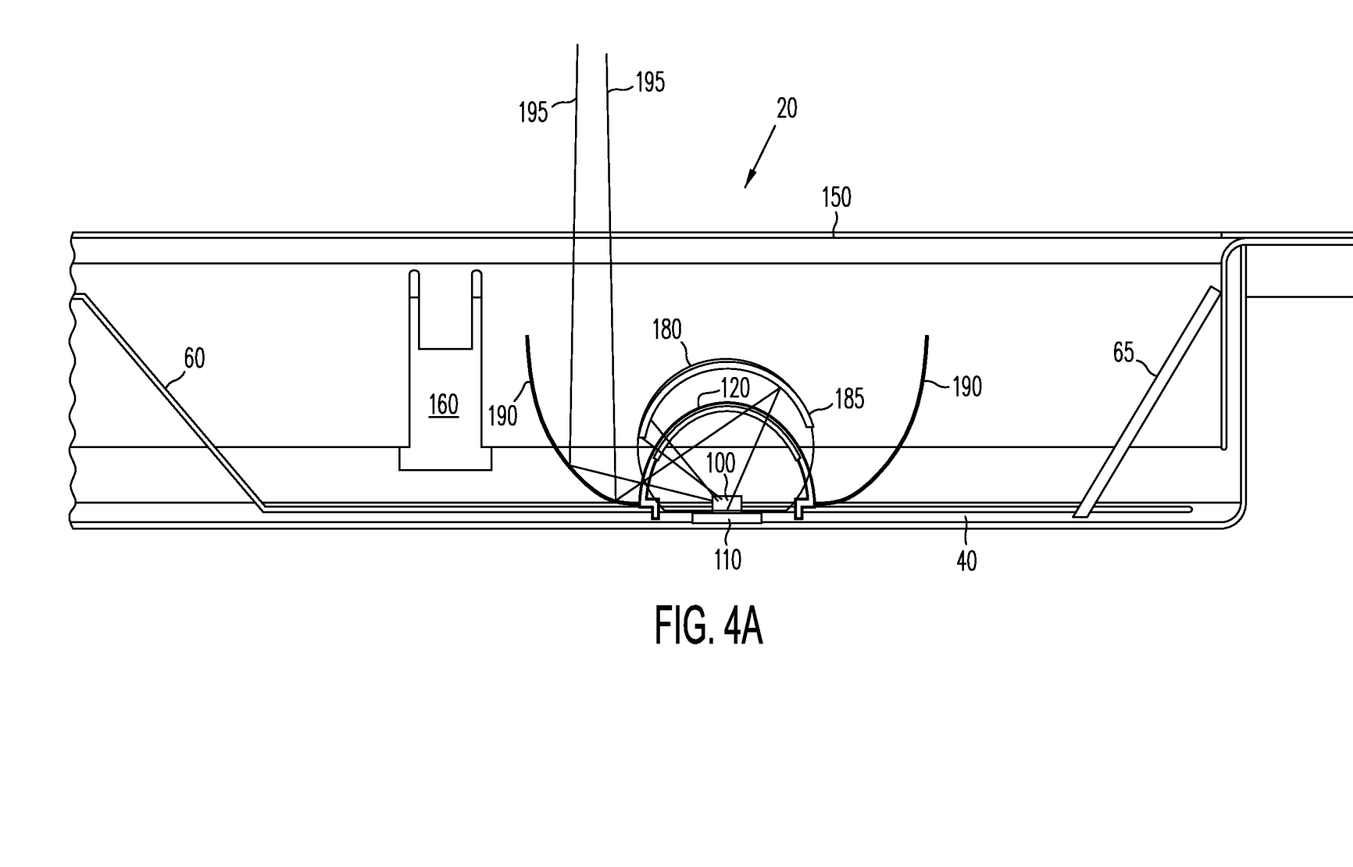
FIG. 4A-4B are simplified cross-sectional views of a portion of the light fixture of FIG. 1 according to various aspects of the present disclosure.

FIG. 4A is a diagrammatic fragmentary cross-sectional side view of a portion of the troffer light fixture 20 of FIG. 1 according to another embodiment of the present disclosure. For reasons of clarity and consistency, similar features in FIGS. 2 and 4 are labeled the same. Referring to FIG. 4A, the diffuser cap 120 is housed within a cover tube 180. The cover tube 180 may also be coated with a film 185. The film 185 may contain white particles and may include one or more regions that have different white particle concentrations, similar to the film 130 (FIGS. 2-3). As such, the cover tube 180 (by way of its different coating regions similar to the diffuser cap 120) can further improve the light output uniformity and reduce light output hot spots. In some embodiments, a cover tube similar to the cover tube 180 may be implemented for the embodiments of the light fixture 20 shown in FIGS. 1-3.

Still referring to FIG. 4A, the cover tube 180 (and the diffuser cap 120 and the LED chip 100 housed therein) is at least partially surrounded by reflectors 190. The reflectors 190 may include a light-reflective material, such as aluminum sheet, stainless steel plate, plastic plate (with minor coating) or other suitable reflective materials. The reflectors 190 may be configured to have different shapes and/or patterns, so that they can reflect light 195 emitted by the LED chip 100 in a desired manner. For example, in the embodiments illustrated in FIG. 4A, the reflectors 190 may have a somewhat curved shape or curved surface. Depending on the specific shape of the reflectors 190, the light 195 emitted by the LED chip 100 may hit and may be reflected by the reflectors 190 in various angles.

Figure 4B:
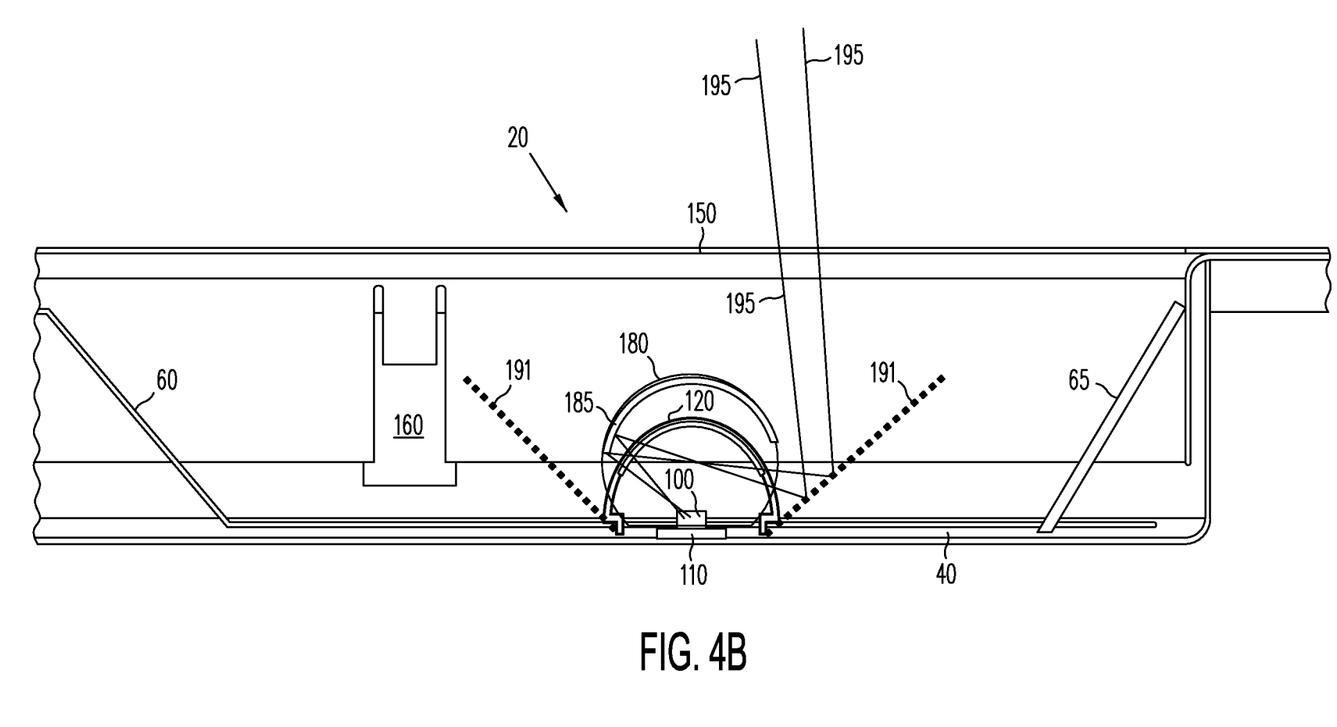

As another example, in the embodiments illustrated in FIG. 4B, the cover tube 180 is at least partially surrounded by reflectors 191, which are similar to the reflectors 190 but have different shapes. For instance, the reflectors 191 may have a substantially straight shape or a flat surface. Thus, the light 195 emitted by the LED chip 100 may hit and may be reflected by the reflectors 191 in a different manner than with the reflectors 190. Stated differently, by configuring the reflectors 190-191 in different curves or slope angles around the cover tube 180, the side-emitting light 195 propagating out of the tube 180 can be distributed to have various photometrical patterns.

In some embodiments, the light reflectors 190-191 may be implemented for the embodiments of the light fixture 20 shown in FIGS. 1-3 as well, that is, the cover tube 180 may not be necessary, and the reflectors 190-191 directly surround the diffuser cap 120. Furthermore, though only two reflectors 190-191 are illustrated herein as examples, any other number of light reflectors may be used in various embodiments. In the case where a plurality of reflectors are used, each of the reflectors may have its own shape and pattern, or a subset of the reflectors may have the same or substantially similar shapes or patterns. The particular shapes and patterns of the light reflectors may be configured flexibly as dictated by the design concerns and manufacturing requirements.

Figures 5, 8:
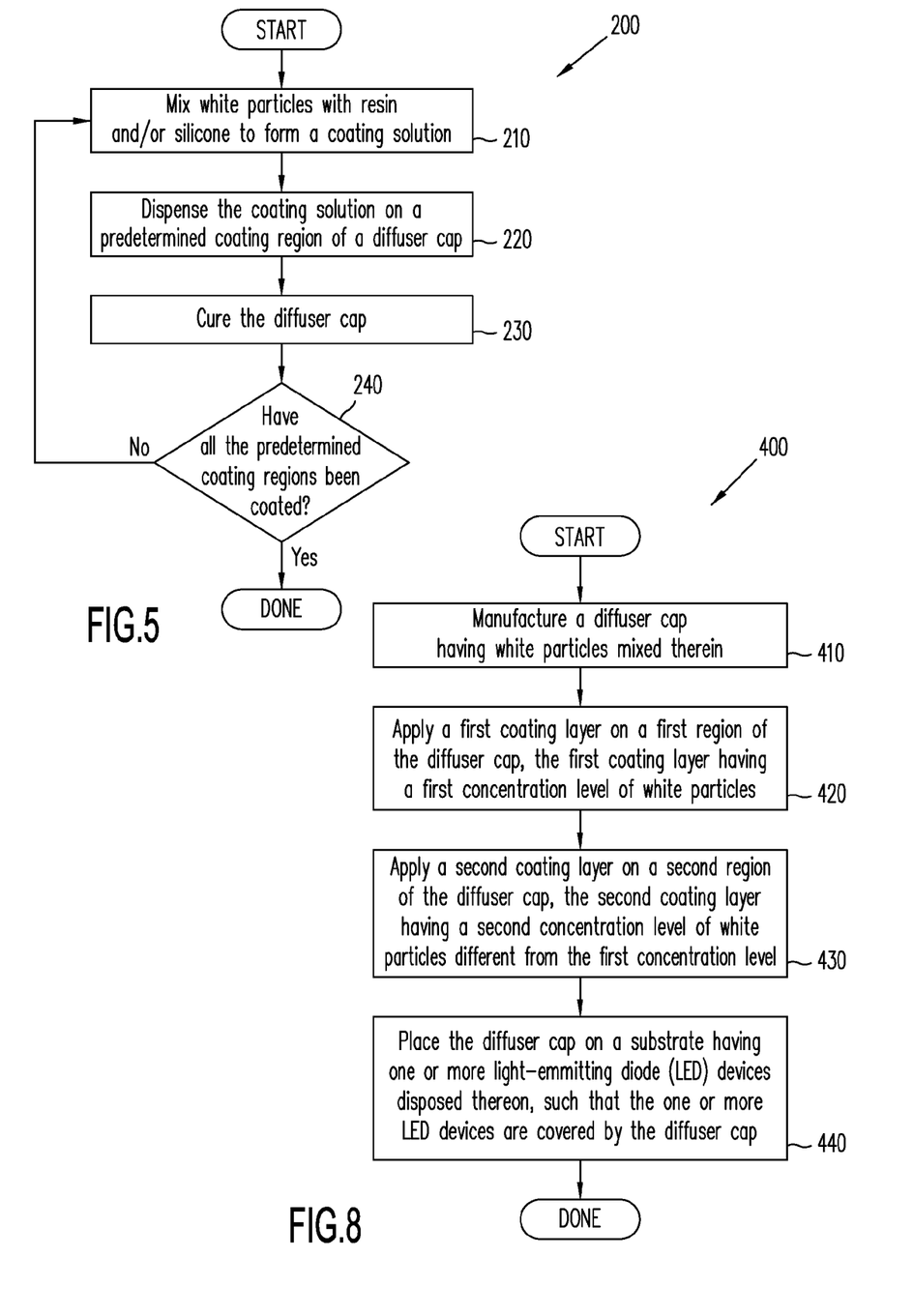
FIG. 5 is a flowchart illustrating a method of applying a coating film to a light fixture according to various aspects of the present disclosure.
FIG. 8 is a flowchart illustrating a method of manufacturing a light fixture according to various aspects of the present disclosure.

FIG. 5 is a flowchart of a method 200 of manufacturing and applying the coating film to the diffuser cap 120. The method 200 begins at step 210, in which the white particles are mixed with resin and/or silicone to form a coating solution. The coating solution is mixed to have a predefined white particle concentration level. The method 200 proceeds to step 220, in which the coating solution is loaded into a dispensing container. The dispensing container is used to apply the coating solution on a predetermined coating region of a diffuser cap. The method 200 then proceeds to step 230, in which the diffuser cap is cured at a predetermined temperature for a predetermined amount of time. For example, in some embodiments, the diffuser cap may be cured at a temperature ranging from about 20 degrees Celsius to about 30 degrees Celsius for about 5 minutes to about 15 minutes. Thereafter, the method 200 proceeds to a decision block 240 to determine whether all the predetermined coating regions have been coated. If the answer is yes, then the method 200 may conclude. If the answer is no, then the method 200 may repeat the steps 210-230 again. During the repetition, the white particle concentration level may be adjusted to be at a different white particle concentration level, and the corresponding coating solution may be applied on a different coating region of the diffuser cap. This cycle may be repeated any number of times until all of the predetermined coating regions have been coated. In this manner, each coating region may have a different white particle concentration level.

Of course, the method 200 illustrated in FIG. 5 is merely one of the many ways of coating a diffuser cap according to the various aspects of the present disclosure. Other embodiments may utilize modified process flows without departing from the spirit and the scope of the present disclosure. For example, in some embodiments, the repetition of the coating cycles may be performed before the curing step—that is, all of the coating regions are coated before a curing process is performed. In some embodiments, the diffuser cap may undergo an optional texturing process, in which the surface of the diffuser cap becomes textured. For example, the diffuser cap may be sandblasted to achieve the textured surface. Alternatively, a plurality of small patterns, such as triangles, circles, squares, or other random polygons may be formed on the surface of the diffuser cap to achieve the textured surface.

In certain embodiments, the diffuser cap may be substantially transparent before any coating process is performed. In other embodiments, the diffuser cap itself may be manufactured to have white particles mixed therein before any white particle coating process is performed. For example, white particles may be mixed within a poly carbonate material, and this white-particle-containing poly carbonate material may then be molded into a proper diffuser cap shape, thereby forming a diffuser cap having white particles mixed therein.

Figure 6A:
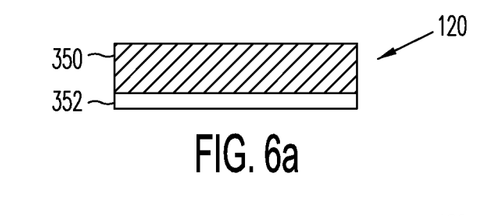
FIGS. 6A-6D and 7 are simplified cross-sectional views of a portion of a diffuser cap according to various aspects of the present disclosure.

Taking the application of phosphor materials into consideration, there are several different embodiments for constructing and applying a coating material (which may or may not include phosphor) to the diffuser cap 120. Referring to FIG. 6a, in one embodiment, the diffuser cap 120 includes a poly carbonate (PC) material diffusion lens 350, which is less than or equal to about 1.3 millimeter (mm) in thickness in some embodiments. In other embodiments, the diffuser cap 120 may include poly methyl methacrylate (PMMA), glass, or other suitable materials. The diffusion lens 350 can be formed by any suitable technique, such as injection molding or extrusion molding.

A relatively thin coating layer 352 is applied on the diffusion lens 350. The coating layer 352 contains white particles for reflecting and diffusing light. The coating layer 352 may also contain resin and/or silicone. In some embodiments, the white particles and the resin have a mixing ratio of about 1:2. In the embodiment shown in FIG. 6a, no phosphor is coated on the diffuser cap 120. Instead, a phosphor layer is coated on the LED emitters that are housed under the diffuser cap 120. As discussed above, the phosphor layer is used to convert a portion of the emitted light to a different wavelength.

Figure 7:
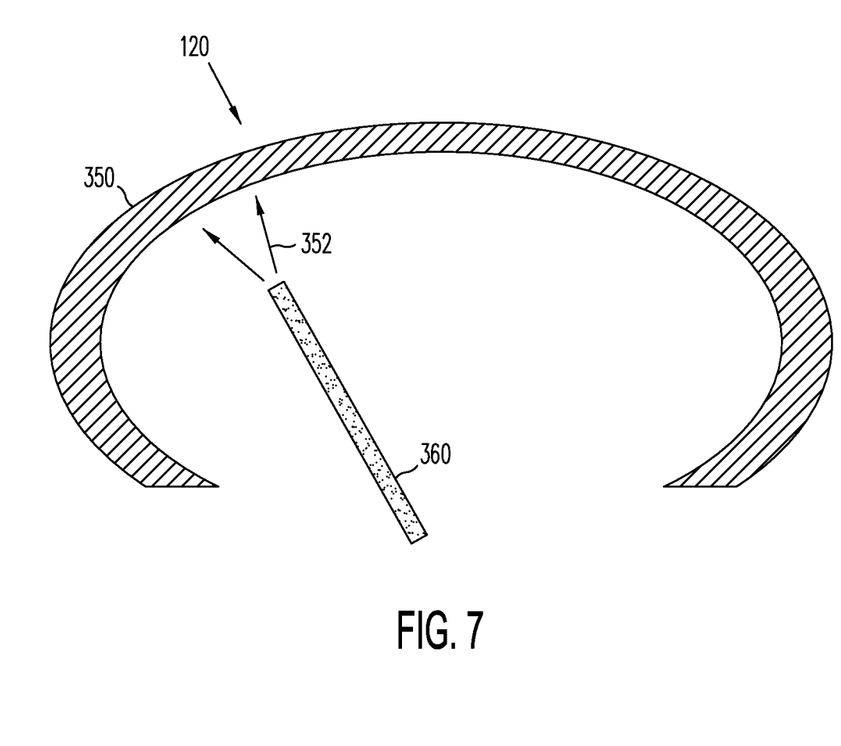

Referring to FIG. 7, the coating material 352 can be applied to the diffusion lens 350 by a dispenser such as a spray nozzle 360. The spray nozzle 360 applies the coating material 352 to the inner surface of the diffusion lens 350. In some embodiments, nearly all of the inner surface of the diffusion lens 350 may be coated with the coating material 352. In other embodiments, the diffusion lens 350 may be partially coated on the diffusion lens. In addition, the diffusion lens 350 may be divided into different coating regions that have various geometries and that are coated with different concentrations of white particles. After the coating material 352 is applied, it is cured at a predetermined temperature for a predetermined amount of time.

Figure 6B:
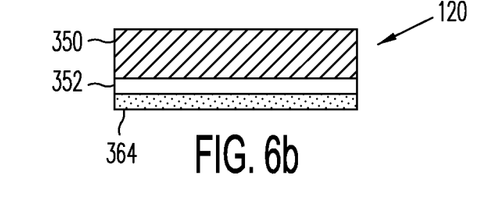

Referring now to FIG. 6b, in another embodiment, the coating of the diffusion lens 350 is a multi-step process. A first step applies the coating material 352, discussed above with reference to FIGS. 6a and 7. Afterwards, a phosphor layer 364 is applied to the diffusion lens 350. The phosphor layer can be applied by a spray nozzle as discussed with reference to FIG. 7, or other conventional process. In this embodiment, the LED emitters housed under the diffuser cap 120 need not be applied a phosphor coating, since phosphor is already coated remotely on the diffuser cap.

Figure 6C:
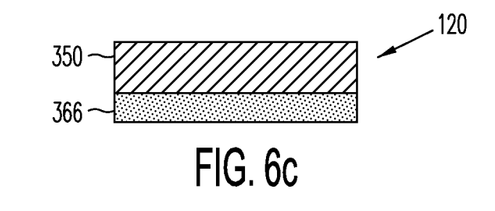
Figure 6D:
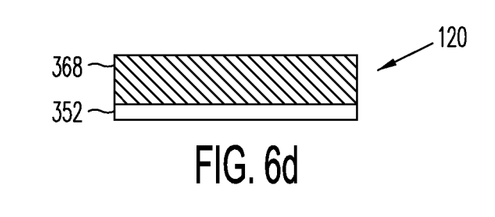

Referring now to FIG. 6c, in another embodiment, the coating material and phosphor layer are mixed together to form a single coating layer 366, which is then applied to the diffusion lens 350. The coating layer 366 can be applied by a spray nozzle as discussed with reference to FIG. 7, or other conventional process. Once again, the LED emitters housed under the diffuser cap 120 need not be applied a phosphor coating, since phosphor is already coated remotely on the diffuser cap Referring now to FIG. 6d, in yet another embodiment, phosphor material can be combined with PC material to form a diffusion lens 368. The diffusion lens 368 can be formed by any suitable technique, such as injection molding or extrusion molding. Afterwards, the coating material 352 is applied to the diffusion lens 350, as discussed above with reference to FIGS. 6a and 7. As is in the case for the embodiments shown in FIGS. 6b and 6c, the LED emitters housed under the diffuser cap 120 need not be applied a phosphor coating, since phosphor is already coated remotely on the diffuser cap FIG. 7 is a flowchart of a method 400 of manufacturing a lighting instrument, for example a troffer light or a batten light. The method 400 includes a step 410, in which a diffuser cap is manufactured. The diffuser cap has white particles mixed therein. The white particles are operable to reflect and diffuse light. In some embodiments, the white particles include calcium sulfate, zinc oxide, barium sulfate, or titanium oxide. The method 400 includes a step 420, in which a first coating layer is applied on a first region of the diffuser cap. The first coating layer has a first concentration level of white particles. The method 400 includes a step 430, in which a second coating layer is applied on a second region of the diffuser cap. The second coating layer has a second concentration level of white particles different from the first concentration level. In some embodiments, the first region and the second region have different sizes and shapes. In some embodiments, one or more additional white-particle-containing coating layers are applied on one or more additional regions of the diffuser cap. The additional regions are different from the first and second regions. In some embodiments, an apex region of the diffuser cap is coated with a coating layer having a highest concentration of white particles. The method 400 includes a step 440, in which the diffuser cap is placed on a substrate having one or more light-emitting diode (LED) devices disposed thereon, such that the one or more LED devices are covered by the diffuser cap.

The embodiments of the present disclosure discussed above offer advantages over existing methods. However, not all advantages of the present disclosure are necessarily discussed herein, and other embodiments may offer different advantages, and that no particular advantage is required for any embodiment. One advantage is that, unlike conventional LED troffer lights, the troffer light of the present disclosure does not have a light intensity that is substantially greater near the center (or apex). The white particle coating concentration can be configured to be higher near the center regions of the diffuser cap so as to reduce the intensity of the light output at the center regions, thereby reducing glare. Another advantage of the troffer light of the present disclosure is that hot spots caused by discrete LED emitters can be substantially eliminated. By applying different coating layers having different white particle concentration levels to various regions of the diffuser cap, the collective light output can be configured to be substantially uniform, thereby making it difficult for a human eye to detect that the light is actually coming from a plurality of discrete light sources. Another advantage of the present disclosure is that by carefully configuring the coating regions of the diffuser cap and their respective white particle concentration levels, a desired light output profile may be achieved. In other words, the light output profile is reconfigurable. Yet another advantage of the present disclosure is that by configuring the light reflectors to have different shapes, sizes, or geometrical patterns around the cover tube (inside which the LED die is placed), each light reflector may reflect light differently (for example at different angles), and therefore the output light uniformity may be further improved.

Though the present disclosure uses troffer light as an example of recessed lighting fixtures, other forms of light fixtures may also incorporate the various aspects of the present disclosure to achieve similar benefits. For example, a batten light fixture may also be configured in a similar manner as discussed above. Furthermore, the specifics regarding the diffuser cap and its coating configurations discussed above and shown in FIGS. 3-6 are merely examples and not intended to be limiting. Alternative arrangements of the diffuser cap and its coating configurations are contemplated according to design needs and manufacturing concerns, but they are not discussed herein for reasons of simplicity.

One of the broader forms of the present disclosure involves a lighting apparatus. The lighting apparatus includes: a plurality of light-emitting diode (LED) devices disposed on a substrate; a diffuser cap located over the substrate, the LED devices being housed under the diffuser cap; and a plurality of coating films each disposed on a different coating area on the diffuser cap, wherein the coating films have varying coating characteristics from one another; wherein the lighting apparatus is a troffer light or a batten light.

In some embodiments, the coating films each contain white particles for reflecting and diffusing light emitted by the LED devices.

In some embodiments, the coating films have varying concentrations of white particles.

In some embodiments, a coating film located at an apex of the diffuser cap has a greatest white particle concentration level.

In some embodiments, the diffuser cap itself has white particles mixed therein.

In some embodiments, the particles include at least one of: calcium sulfate, zinc oxide, barium sulfate, and titanium oxide.

In some embodiments, the coating films each further contain silicone and resin.

In some embodiments, the diffuser cap has a shape that is one of: a half hemisphere shape, an elliptical shape, and a polygonal shape; and the coating areas have different sizes and shapes from one another.

In some embodiments, the lighting apparatus further includes a plurality of reflectors located around the diffuser cap, wherein the reflectors have different shapes.

Another one of the broader forms of the present disclosure involves a lighting instrument. The lighting instrument includes a recessed light fixture. The recessed light fixture includes: a plurality of light-emitting diode (LED) devices located on a board; a diffuser cap housing the LED devices therein, wherein the diffuser cap includes a plurality of coating regions, and wherein each coating region is coated by a film containing white particles operable to reflect and diffuse light emitted by the LED devices, and wherein the film in each coating region has a different white particle concentration level.

In some embodiments, the recessed light fixture is a troffer light fixture.

In some embodiments, the diffuser cap has white particles mixed therein, and the coating regions have varying geometries.

In some embodiments, the white particles include at least one of: calcium sulfate, zinc oxide, barium sulfate, and titanium oxide; and the film further contains silicone or resin.

In some embodiments, the white particle concentration level is highest at an apex region of the diffuser cap.

In some embodiments, the lighting instrument further includes a plurality of light reflectors, wherein at least some of the light reflectors have different geometric patterns.

Another one of the broader forms of the present disclosure involves a method of manufacturing a lighting instrument. The method includes: manufacturing a diffuser cap having white particles mixed therein, the white particles being operable to reflect and diffuse light; applying a first coating layer on a first region of the diffuser cap, the first coating layer having a first concentration level of white particles; applying a second coating layer on a second region of the diffuser cap, the second coating layer having a second concentration level of white particles different from the first concentration level; and placing the diffuser cap on a substrate having one or more light-emitting diode (LED) devices disposed thereon, such that the one or more LED devices are covered by the diffuser cap.

In some embodiments, the first region and the second region have different sizes and shapes.

In some embodiments, the particles include at least one of: calcium sulfate, zinc oxide, barium sulfate, and titanium oxide.

In some embodiments, the method further includes: applying one or more additional white-particle-containing coating layers on one or more additional regions of the diffuser cap, wherein the additional regions are different from the first and second regions.

In some embodiments, an apex region of the diffuser cap is coated with a coating layer having a highest concentration of white particles.

In some embodiments, the lighting instrument is a troffer light or a batten light.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lighting apparatus, comprising:
   a plurality of light-emitting diode (LED) devices disposed on a substrate;
   a diffuser cap located over the substrate, wherein the diffuser cap has a curved shape such that the LED devices are at least partially encircled by the diffuser cap in a cross-sectional view;
   a plurality of coating films each disposed on a different coating area on the diffuser cap, wherein the coating films have varying coating characteristics from one another and
   a cover tube that houses the diffuser cap within, wherein the cover tube is coated with a layer that contains white particles;
   wherein the lighting apparatus is a troffer light or a batten light.

2. The lighting apparatus of claim 1, wherein the coating films each contain white particles for reflecting and diffusing light emitted by the LED devices, and wherein the coating films have varying concentrations of white particles.

3. The lighting apparatus of claim 2, wherein the coating film located at an apex of the diffuser cap has a greatest white particle concentration level.

4. The lighting apparatus of claim 2, wherein the diffuser cap itself has white particles mixed therein.

5. The lighting apparatus of claim 2, wherein:
   the particles include at least one of: calcium sulfate, zinc oxide, barium sulfate, and titanium oxide; and
   the coating films each further contain silicone and resin.

6. The lighting apparatus of claim 1, wherein the cover tube is at least partially surrounded by a plurality of reflectors.

7. The lighting apparatus of claim 1, wherein:
   the curved shape of the diffuser cap conforms to one of: a half hemisphere shape and an elliptical shape; and
   the coating areas have different sizes and shapes from one another.

8. A lighting instrument, comprising:
   a recessed light fixture that includes:
      a plurality of light-emitting diode (LED) devices located on a board;
      a diffuser cap housing the LED devices therein, wherein the diffuser cap has a curved shape such that the LED devices are collectively encircled by the diffuser cap and the board, and wherein the diffuser cap includes a plurality of coating regions, and wherein each coating region is coated by a film containing white particles operable to reflect and diffuse light emitted by the LED devices, and wherein the film in each coating region has a different white particle concentration level; and
      a cover tube inside which the diffuser cap is disposed, wherein the cover tube is coated with a layer that contains further white particles, and wherein the layer includes one or more regions having different concentrations of the further white particles.

9. The lighting instrument of claim 8, wherein the recessed light fixture is a troffer light fixture.

10. The lighting instrument of claim 8, wherein:
    the diffuser cap has white particles mixed therein; and
    the coating regions have varying geometries.

11. The lighting instrument of claim 8, wherein:
    the white particles include at least one of: calcium sulfate, zinc oxide, barium sulfate, and titanium oxide; and
    the film further contains silicone or resin.

12. The lighting instrument of claim 8, wherein the white particle concentration level is highest at an apex region of the diffuser cap.

13. The lighting instrument of claim 8, further comprising: a plurality of light reflectors that are disposed around the cover tube.

14. A method of manufacturing a lighting instrument, comprising:
    manufacturing a diffuser cap having white particles mixed therein, the white particles being operable to reflect and diffuse light, wherein the diffuser cap has a curved shape;
    applying a first coating layer on a first region of the diffuser cap, the first coating layer having a first concentration level of white particles;
    applying a second coating layer on a second region of the diffuser cap, the second coating layer having a second concentration level of white particles different from the first concentration level;
    placing the diffuser cap on a substrate having one or more light-emitting diode (LED) devices disposed thereon, such that the one or more LED devices are at least partially circumferentially covered by the diffuser cap; and
    placing a cover tube over the diffuser cap such that the diffuser cap is housed within the cover tube, wherein the cover tube is coated with a film containing white particles.

15. The method of claim 14, wherein the first region and the second region have different sizes and shapes.

16. The method of claim 14, wherein the particles include at least one of: calcium sulfate, zinc oxide, barium sulfate, and titanium oxide.

17. The method of claim 14, further comprising: applying one or more additional white-particle-containing coating layers on one or more additional regions of the diffuser cap, wherein the additional regions are different from the first and second regions, and wherein an apex region of the diffuser cap is coated with a coating layer having a highest concentration of white particles.

18. The method of claim 14, wherein the lighting instrument is a troffer light or a batten light.

19. The lighting apparatus of claim 1, wherein the layer that is coated on the cover tube is divided into a plurality of regions having different concentrations of the white particles.

20. The method of claim 14, wherein the film coated on the cover tube includes a plurality of regions having varying white particle concentrations.

\* \* \* \* \*